(12) United States Patent
Kim et al.

(10) Patent No.: US 9,171,935 B2
(45) Date of Patent: Oct. 27, 2015

(54) FINFET FORMATION WITH LATE FIN REVEAL

(71) Applicant: INTERNATIONAL BUSINESS MACHINES CORPORATION, Armonk, NY (US)

(72) Inventors: Seong-Dong Kim, LaGrangeville, NY (US); Myung-Hee Na, Lagrangeville, NY (US); Jin Z. Wallner, Pleasant Valley, NY (US); Thomas A. Wallner, Albany, NY (US); Qintao Zhang, Mount Kisco, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/200,104

(22) Filed: Mar. 7, 2014

(65) Prior Publication Data
US 2015/0255569 A1    Sep. 10, 2015

(51) Int. Cl.
*H01L 21/337* (2006.01)
*H01L 21/8234* (2006.01)
*H01L 29/66* (2006.01)

(52) U.S. Cl.
CPC ................................. *H01L 29/6681* (2013.01)

(58) Field of Classification Search
USPC .......................................................... 438/197
See application file for complete search history.

(56) References Cited

U.S. PATENT DOCUMENTS

| 2012/0235234 | A1 | 9/2012 | Chang et al. | |
| 2012/0313170 | A1 | 12/2012 | Chang et al. | |
| 2013/0065371 | A1 | 3/2013 | Wei et al. | |
| 2013/0214357 | A1 | 8/2013 | Chang et al. | |
| 2014/0145242 | A1* | 5/2014 | Huang et al. | 257/192 |

* cited by examiner

*Primary Examiner* — Asok K Sarkar
(74) *Attorney, Agent, or Firm* — Matthew C. Zehrer

(57) ABSTRACT

A FinFET semiconductor device fabrication process includes forming a plurality of FinFET fins upon a semiconductor substrate, forming a first dielectric layer upon the semiconductor substrate so that an upper surface of the first dielectric layer is coplanar with upper surfaces of the FinFET fins, forming a plurality of dummy gates upon the FinFET fins and the first dielectric layer orthogonal to the FinFET fins, revealing the FinFET fins by removing first portions of the first dielectric layer from source-drain regions, removing the dummy gates, and subsequent to the removal of the dummy gates, revealing the FinFET fins by removing second portions of the first dielectric layer from channel regions.

20 Claims, 8 Drawing Sheets

FINFET FORMATION WITH LATE FIN REVEAL

FIELD

Embodiments of invention generally relate to semiconductor devices and semiconductor device fabrication methods. More particularly, embodiments relate to semiconductor structures with a FinFET revealed late in fabrication.

BACKGROUND

Currently when making semiconductor structures with three dimensional FinFETs, the standard is to form the fin early in the fabrication process; generally before well ion implants. However, early fin reveal can cause a multitude of subsequent issues. For example, increased structure topology resulting from the early fin reveal makes gate formation difficult because of various patterning levels. This topology variation may lead to dummy poly fill voids and defects between fins. In the future, FinFETs with smaller FIN pitch will likely be needed for increased performance leading to exasperated complications if the fins are revealed early in structure fabrication.

SUMMARY

Embodiments relate to semiconductor structures with a FinFET revealed late in fabrication. For example, the FinFET may be revealed subsequent to removal of a dummy gate associated with gate last fabrication processes.

In an embodiment of the present invention, a FinFET semiconductor device fabrication process includes: forming a plurality of FinFET fins upon a semiconductor substrate; forming a first dielectric layer upon the semiconductor substrate so that an upper surface of the first dielectric layer is coplanar with upper surfaces of the FinFET fins; forming a plurality of dummy gates upon the FinFET fins and the first dielectric layer orthogonal to the FinFET fins; revealing first segments of the FinFET fins by removing first portions of the first dielectric layer covering the FinFET fins in source-drain regions; removing the dummy gates; and subsequent to the removal of the dummy gates, revealing second segments of the FinFET fins by removing second portions of the first dielectric layer covering the FinFET fins in channel regions.

In certain embodiments, forming the first dielectric layer upon the semiconductor substrate includes: depositing the first dielectric layer upon the semiconductor substrate covering the FinFET fins, and planarizing the first dielectric layer so that the upper surface of the first dielectric layer is coplanar with the upper surfaces of the FinFET fins.

In certain embodiments, the FinFET semiconductor device fabrication process further includes forming a gate oxide layer upon the upper surface of the first dielectric layer and the upper surface of the plurality of FinFET fins.

In certain embodiments, forming the plurality of dummy gates upon the semiconductor substrate includes forming dummy gate material upon the gate oxide layer, and patterning the plurality of dummy gates from the dummy gate material.

In certain embodiments, the FinFET semiconductor device fabrication process further includes forming gate spacers adjacent to sidewalls of the plurality of dummy gates; recessing the plurality of FinFET fins to create fin segments, and/or growing epitaxy within the recesses to merge the fin segments.

In certain embodiments, the FinFET semiconductor device fabrication process further includes subsequent to revealing the first segments of the FinFET fins by removing first portions of the dielectric layer from source-drain regions, depositing a second dielectric layer upon the first dielectric layer covering the revealed first portions of the FinFET fins and the dummy gates, and planarizing the second dielectric layer so that an upper surface of the second dielectric layer is coplanar with upper surfaces of the dummy gates.

In various embodiments the semiconductor substrate may be a bulk semiconductor substrate or a silicon-on-insulator semiconductor substrate. In embodiment, the gate oxide layer associated with each dummy gate may be retained subsequent to removing the dummy gates.

In an embodiment of the present invention, another FinFET semiconductor device fabrication process includes: forming a plurality of FinFET fins upon a semiconductor substrate; forming a first dielectric layer upon the semiconductor substrate so that an upper surface of the first dielectric layer is coplanar with upper surfaces of the FinFET fins; forming a plurality of dummy gates upon the FinFET fins and the first dielectric layer orthogonal to the FinFET fins; revealing first segments of the FinFET fins by removing first portions of the first dielectric layer covering the FinFET fins in source-drain regions; removing the dummy gates resulting in a plurality of channel region trenches; and subsequent to the removal of the dummy gates, revealing second segments of the FinFET fins by removing second portions of the first dielectric layer covering the FinFET fins in channel regions.

In certain embodiments, the FinFET semiconductor device fabrication process further includes subsequent to revealing the second segments of the FinFET fins by removing second portions of the dielectric layer from channel regions, forming replacement gates within the channel region trenches. In various embodiments, the upper surfaces of the first portions of the first dielectric layer may be coplanar with upper surfaces of the second portions of the first dielectric layer and the removal of the first portions of the first dielectric layer from source-drain regions and the removal of the second portions of the first dielectric layer from channel regions results in a retained dielectric layer surrounding the FinFET fins.

In certain embodiments, an upper surface of the retained dielectric layer may be below the upper surfaces of the FinFET fins.

In certain embodiments, forming replacement gates within the channel region trenches includes forming a gate oxide layer upon the retained dielectric layer and the recessed plurality of FinFET fins; forming gate material upon the gate oxide layer, and forming a gate cap upon the gate material.

In various embodiments, spacers are formed adjacent to sidewalls of the channel region trenches subsequent to revealing the FinFET fins by removing second portions of the dielectric layer from channel regions.

In certain embodiments, the FinFET semiconductor device fabrication process further includes planarizing the replacement gates so that upper surfaces of the replacement gates is coplanar with the top surface of the second dielectric layer.

In yet another embodiment of the present invention, a FinFET semiconductor device fabrication process includes: forming a plurality of FinFET fins upon a semiconductor substrate; forming a first dielectric layer upon the semiconductor substrate so that an upper surface of the first dielectric layer is coplanar with upper surfaces of the FinFET fins; forming a plurality of dummy gates upon the FinFET fins and the first dielectric layer orthogonal to the FinFET fins; revealing first segments of the FinFET fins by removing first portions of the first dielectric layer covering the FinFET fins in source-drain regions; removing the dummy gates resulting in a plurality of channel region trenches; subsequent to the removal of the dummy gates, revealing second segments of the FinFET fins by removing second portions of the first dielectric layer covering the FinFET fins in channel regions; subsequent to revealing the second segments of the FinFET fins by removing second portions of the dielectric layer from channel regions adjacent to the FinFET fins, forming replacement gates within the channel region trenches; and subsequent to removing the dummy gates, forming a third dielectric layer upon the second dielectric layer and upon the first dielectric layer within the channel region trenches covering the FinFET fins.

In certain embodiments the FinFET semiconductor device fabrication process further includes prior to the forming replacement gates, removing the third dielectric layer material within the channel region trenches.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures utilizing FinFETs. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Referring now to the figures, wherein like components are labeled with like numerals, exemplary fabrication steps of forming a semiconductor structure 10 in accordance with embodiments of the present invention are shown, and will now be described in greater detail below. It should be noted that some of the figures depict various cross section views of structure 10 the orientation of which is denoted in reference to particular figures. Furthermore, it should be noted that while this description may refer to some components of the structure 10 in the singular tense, more than one component may be depicted throughout the figures. However, it is noted that specific elements may be denoted by a numeral and a subscript (e.g. 15a, etc.). When those elements are referred to generically, merely the numeral is used (e.g. 15, etc.). The specific number of components depicted in the figures and the cross section orientation was chosen to best illustrate the various embodiments described herein.

Figure 1:
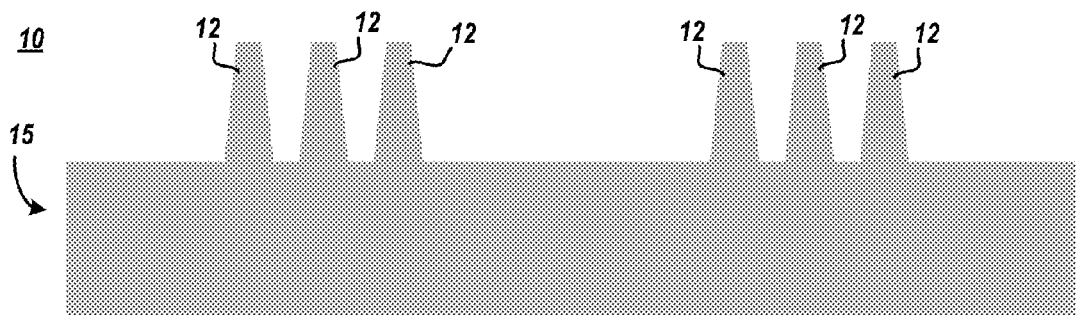
FIG. 1-FIG. 19 depict cross section views of a semiconductor structure at intermediate stages of semiconductor device fabrication, in accordance with various embodiments of the present invention.

FIG. 1 depicts a cross section view of semiconductor structure 10 at an intermediate stage of semiconductor device fabrication, in accordance with various embodiments of the present invention. At this stage of fabrication, fins 12 are formed, patterned, etc. upon a substrate 15. The orientation of FIG. 1 illustrates a view plane perpendicular to fins 12.

Substrate 15 may be, for example, a layered substrate 15a or a bulk substrate 15b. Layered substrate 15a may be as Si/SiGe, a silicon-on-insulator (SOI), or a SiGe-on-insulator (SGOI). Bulk semiconductor substrate 15b materials may include undoped Si, n-doped Si, p-doped Si, single crystal Si, polycrystalline Si, amorphous Si, Ge, SiGe, SiC, SiGeC, GaAs, InAs, InP, etc. The plurality of fins 12 may be etched from the substrate 15b.

When layered substrate 15a is utilized, it may include a base substrate, a dielectric layer formed on top of the base substrate, and a SOI layer formed on top of the buried dielectric layer. The buried dielectric layer a may isolate the SOI layer from the base substrate. The plurality of fins 12 may be etched from the SOI layer. The base substrate may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm, though less and greater thicknesses have been contemplated. In one embodiment, the buried dielectric layer may have a thickness ranging from about 150 nm to about 180 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer may include semiconducting materials that have at least different crystallographic orientations. Typically, the SOI layer may include a thickness ranging from about 5 nm to about 100 nm, though less and greater thicknesses have been contemplated. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

Generally, fins 12 may be formed, patterned, etc. upon a semiconductor structure 10 by other known processes or techniques without deviating from the spirit of those embodiments herein claimed.

Figure 2:
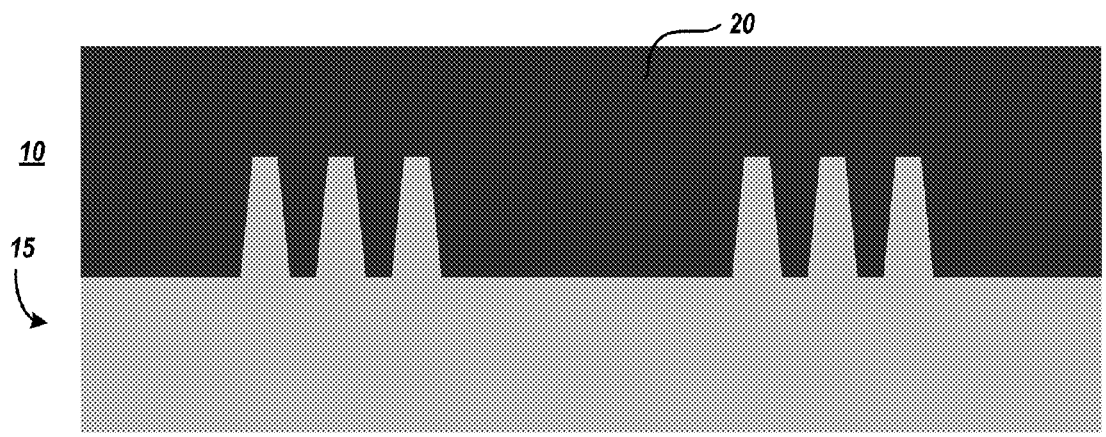

FIG. 2 depicts a cross section view of a semiconductor structure 10 at an intermediate stage of semiconductor device fabrication, in accordance with various embodiments of the present invention. At this stage of fabrication, dielectric layer 20 is formed. The orientation of FIG. 2 illustrates a view plane perpendicular to fins 12.

Dielectric layer 20 may be formed upon substrate 15 and formed between fins 12 and may include any of several dielectric materials, for example, oxides, nitrides and oxynitrides of silicon. The dielectric layer 20 may also include oxides, nitrides and oxynitrides of elements other than silicon. In addition, the dielectric layer 20 may include crystalline or non-crystalline dielectric material. Moreover, the dielectric portions may be formed using any of several known methods, for example, chemical vapor deposition methods, and physical vapor deposition methods. In some embodiments, dielectric layer 20 is formed to a thickness greater than the height of fins 12. In certain embodiments, dielectric layer 20 may be a HARP (High Aspect Ratio Process) CVD (chemical vapor deposition) oxide fill.

Generally, dielectric layer 20 may be formed, deposited, etc. upon a semiconductor structure 10 by other known processes or techniques without deviating from the spirit of those embodiments herein claimed.

Figure 3:
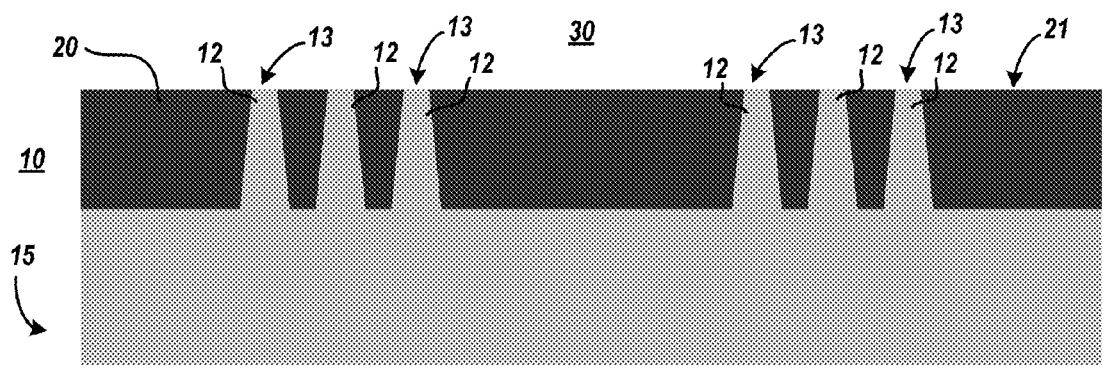

FIG. 3 depicts a cross section view of a semiconductor structure 10 at an intermediate stage of semiconductor device fabrication, in accordance with various embodiments of the present invention. At this stage of fabrication, dielectric layer 20 material above fins 12 is removed. The orientation of FIG. 3 illustrates a view plane perpendicular to fins 12.

Dielectric layer 20 may be planarized to the top surface 13 of fins 12 using a chemical mechanical polishing (CMP) technique 30. In one embodiment, the CMP technique 30 may use a ceria based slurry to recess the dielectric layer 20. The CMP technique 30 may be designed to improve planarity of an upper surface 21 of dielectric layer 20 and one or more top surfaces 13 of fins 12 and may advantageously eliminate non planer surfaces of structure 10 caused by variations in dielectric layer 20 pattern density, etc. Generally, dielectric layer 20 material above fins 12 may be removed with other known or additional techniques than those described without deviating from the spirit of those embodiments herein claimed.

Figure 4:
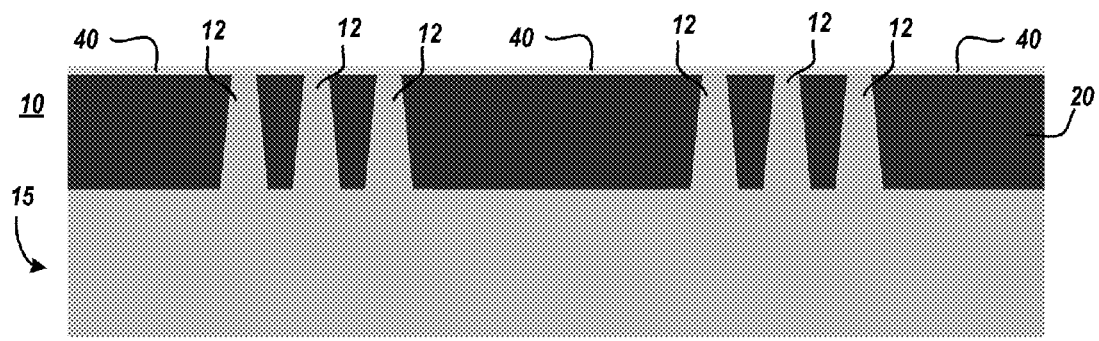

FIG. 4 depicts a cross section view of a semiconductor structure 10 at an intermediate stage of semiconductor device fabrication, in accordance with various embodiments of the present invention. At this stage of fabrication, gate oxide layer 40 is formed upon upper surface 13 of fins 12 and upper surface 21 of dielectric layer 20. The orientation of FIG. 4 illustrates a view plane perpendicular to fins 12.

The gate oxide layer 40 may include, for example, a silicon oxide or a silicon oxynitride. In one embodiment, the gate oxide layer 40 can be formed by the deposition of silicon oxide, silicon nitride, or silicon oxynitride by CVD, atomic layer deposition (ALD), etc. The gate oxide layer 40 may have a thickness ranging from about 1 nm to about 10 nm, although a thickness less than 1 nm and greater than 10 nm have been contemplated. In one embodiment, the gate oxide layer 40 may be about 5 nm thick. In some embodiments, the gate oxide layer 40 may be sacrificial and/or replaced in subsequent operations. Generally, gate oxide layer 40 may be formed by other known or additional techniques than those described without deviating from the spirit of those embodiments herein claimed.

Figure 5A:
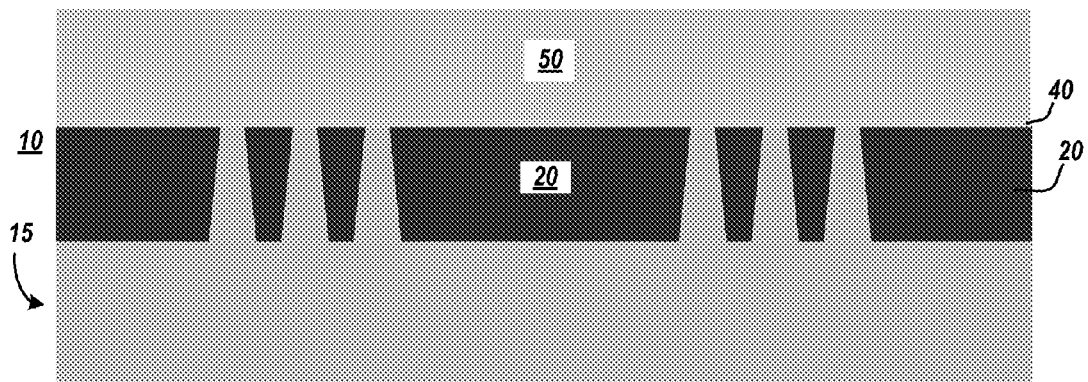
Figure 5B:
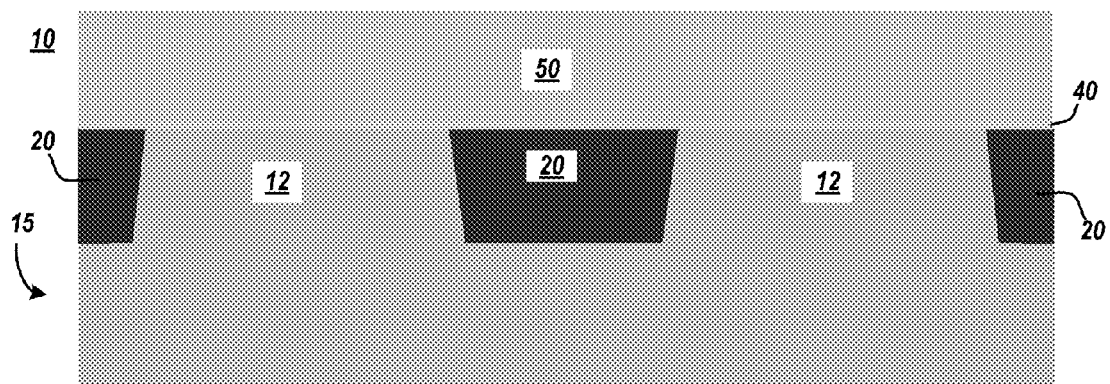

FIG. 5A depicts a cross section view of a semiconductor structure 10 at an intermediate stage of semiconductor device fabrication and FIG. 5B depicts an orthogonal cross section view of the semiconductor structure 10 at the intermediate stage of semiconductor device fabrication, in accordance with various embodiments of the present invention. At this stage of fabrication, dummy gate material 50 is formed upon structure 10. The orientation of FIG. 5A illustrates a view plane perpendicular to fins 12 and the orientation of FIG. 5B illustrates a view plane parallel to fins 12. In various embodiments, dummy gate material 50 may be a poly or nitride layer deposited on the gate oxide layer 40. In certain embodiments, dummy gate material 50 can also be a metal or any sacrificial material, as the dummy gate material 50 may be etched away during a later processing step and replaced with a permanent gate structure. In particular embodiments, dummy gate material 50 may be amorphous silicon deposited by e.g. plasma-enhanced chemical vapor deposition (PECVD). In certain embodiments, the oxide layer 40 may be a dielectric material that can function as an etch stop layer during subsequent removal of dummy gate material 50. Similarly, the dummy gate material 50 may be a dielectric or conducting material that can be removed selectively with respect to the oxide layer 40 and gate spacers 70. The thickness of dummy gate material 50 may be from 10 nm to 500 nm, although lesser and greater thicknesses have been contemplated and are employed in further embodiments. Generally, dummy gate material 50 may be formed by other known or additional techniques than those described without deviating from the spirit of those embodiments herein claimed.

Figure 6:
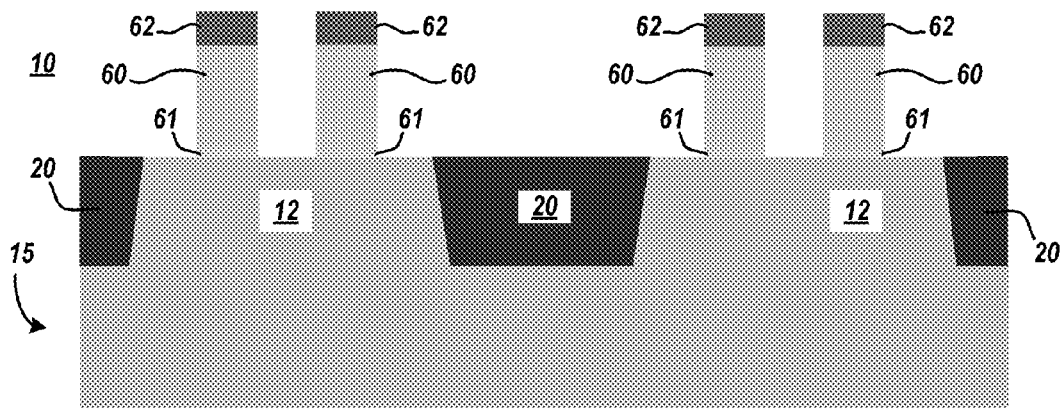

FIG. 6 depicts a cross section view of a semiconductor structure 10 at an intermediate stage of semiconductor device fabrication, in accordance with various embodiments of the present invention. At this stage of fabrication, dummy gates 60 are formed upon structure 10. The orientation of FIG. 6 illustrates a view plane parallel to fins 12.

In embodiments, particular dummy gate(s) 60 may be associated with an NFET device formed on a first active area of structure 10; whereas, other dummy gate(s) 60 may be associated with a PFET device formed on a second active area of structure 10. In embodiments, the dummy gates 60 can be formed using lithographic and etching processes. For example, the lithography step may entail applying a photoresist, exposing the photoresist to a pattern of radiation, and developing the pattern utilizing a resist developer. Following the lithography step, an etching process such as reactive-ion etching (RIE) may be employed in transferring the pattern to the dummy gates 60. In certain embodiments, poly, nitride, metal or other cap 62 may be formed upon dummy gates 60 to form gate stacks.

In certain embodiments, gate stacks may be formed by depositing a nitride cap layer upon dummy gate material 50 to form a hardmask. The nitride cap layer may be deposited using low-pressure chemical vapor deposition (LPCVD) to a thickness of from about 15 nm to about 20 nm. The nitride cap layer may then be patterned in accordance with desired locations of the gate stacks. Using the nitride cap layer as a mask, an RIE may be used to remove portions of the dummy gate material 50 outside the gate stack footprint, defining the gate stacks.

Dummy gates 60 may be formed to act as a place holder for actual gate structures that is formed in subsequent fabrication steps. In certain embodiments, dummy gate stack structure of various embodiment includes a gate oxide portion 61 formed from gate oxide layer 40, dummy gate 60 formed from dummy gate material 50, and a cap 62. Generally, the dummy gate stack structures may be formed by other known or additional techniques than those described without deviating from the spirit of those embodiments herein claimed.

Figure 7:
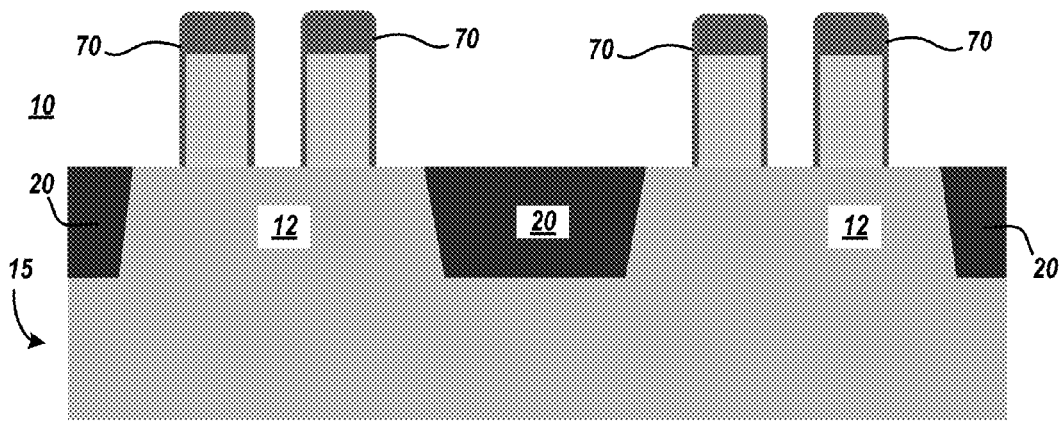

FIG. 7 depicts a cross section view of a semiconductor structure 10 at an intermediate stage of semiconductor device fabrication, in accordance with various embodiments of the present invention. At this stage of fabrication, gate spacers 70 are formed upon structure 10. The orientation of FIG. 7 illustrates a view plane parallel to fins 12.

Gate spacers 70 may be a dielectric material, such as silicon oxide, silicon nitride, silicon oxynitride, or a combination, formed on the sidewalls of the gate stacks. The gate spacer 70 may be formed by deposition of a dielectric material layer and then etching to remove the dielectric material except from the sidewalls of the dummy gate stack. The thickness of the gate spacer 70 may be from 10 nm to 120 nm, and typically from 20 nm to 60 nm, although lesser and greater thicknesses have been contemplated are employed in further embodiments. The material of gate spacers 70 is chosen such that dummy gate 60 may be removed selectively with respect to gate spacers 70. For instance, if dummy gate material 50 is silicon, gate spacers may be a nitride, etc. Generally, the gate spacers 70 may be formed by other known or additional techniques than those described without deviating from the spirit of those embodiments herein claimed.

Figure 8:
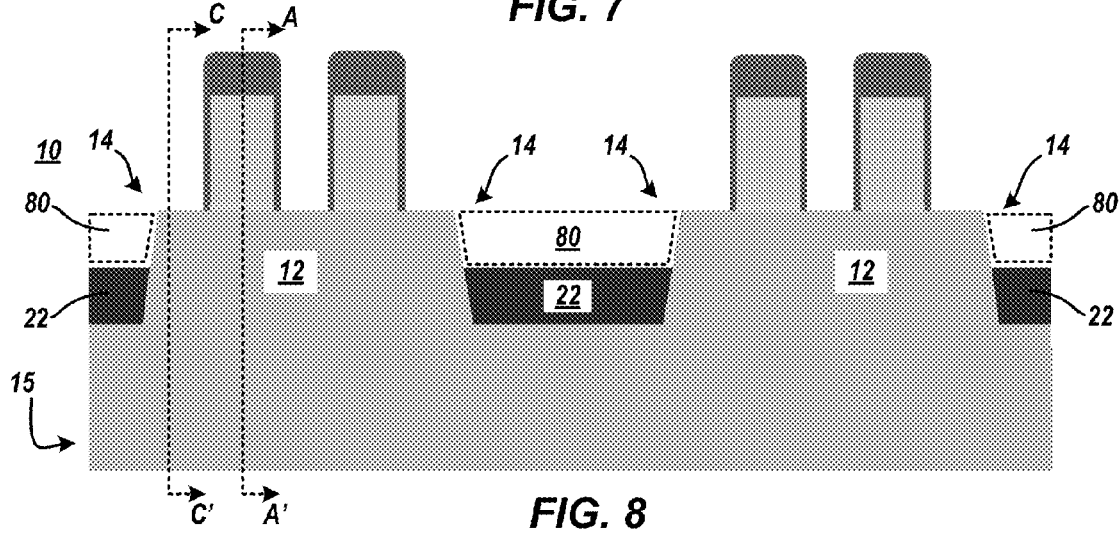

FIG. 8 depicts a cross section view of a semiconductor structure 10 at an intermediate stage of semiconductor device fabrication, in accordance with various embodiments of the present invention. At this stage of fabrication, fins 12 are partially revealed within the source/drain regions of structure 10. The orientation of FIG. 8 illustrates a view plane parallel to fins 12.

Fins 12 are partially revealed by for example, etching to remove portions 80 of dielectric layer 20 within source/drain regions of semiconductor structure 10. The portions 80 may be removed using any suitable etching technique such as dry etch, wet etch, or combination of both. The etching technique may require a etch mask to be formed upon and to protect portions of semiconductor device 10 which resists etching and may be a photoresist or a more durable mask, such as silicon nitride. In particular embodiments, fins 12 are partially revealed using an isotropic oxide wet etch timed to remove portions 80 of dielectric layer 20 to expose partial sidewalls 14 of fins 12 and to retain portions 22 of dielectric layer 20. In certain embodiments, the etchant is chosen to provide a selective removal of portions 80 within source/drain regions of semiconductor structure 10 whilst not removing fins 12. In certain embodiments, the height of portions 80 and the height of portions 22 may be approximately equal.

Figure 9A:
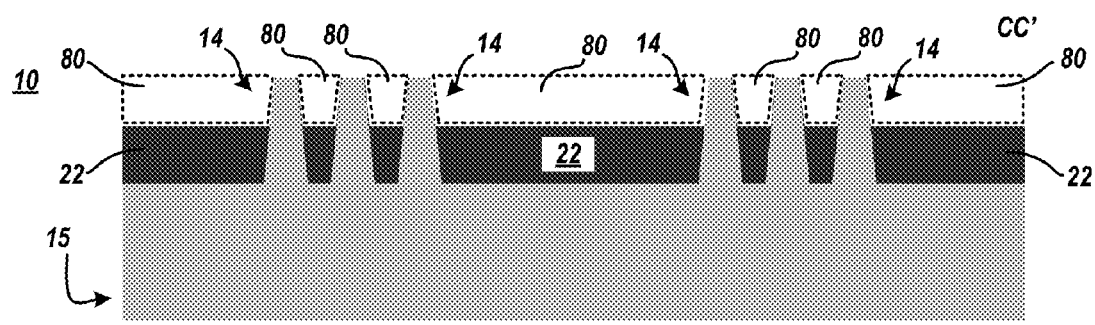
Figure 9B:
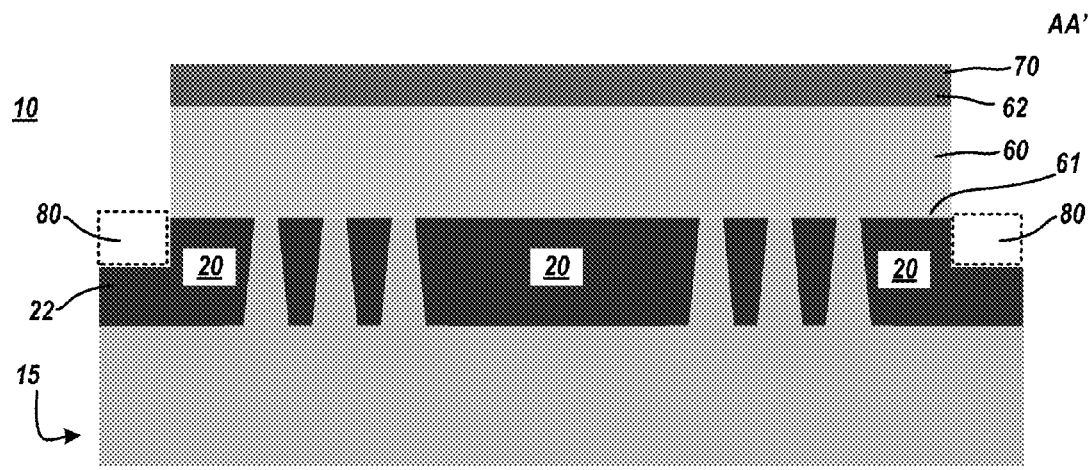

FIG. 9A and FIG. 9B depicts a cross section view of a semiconductor structure 10 at a similar stage of semiconductor device fabrication as shown in FIG. 8. The orientation of FIG. 9A illustrates a view along the C-C' plane as shown in FIG. 8. The orientation of FIG. 9B illustrates a view along the A-A' plane as shown in FIG. 8. FIG. 9A and FIG. 9B further depict the removal of portions 80 and retention of portions 22 of dielectric layer 20 within source/drain regions of semiconductor structure 10. Generally, fins 12 may be partially revealed within the source/drain regions of structure 10 by other known or additional techniques than those described without deviating from the spirit of those embodiments herein claimed.

Figure 10:
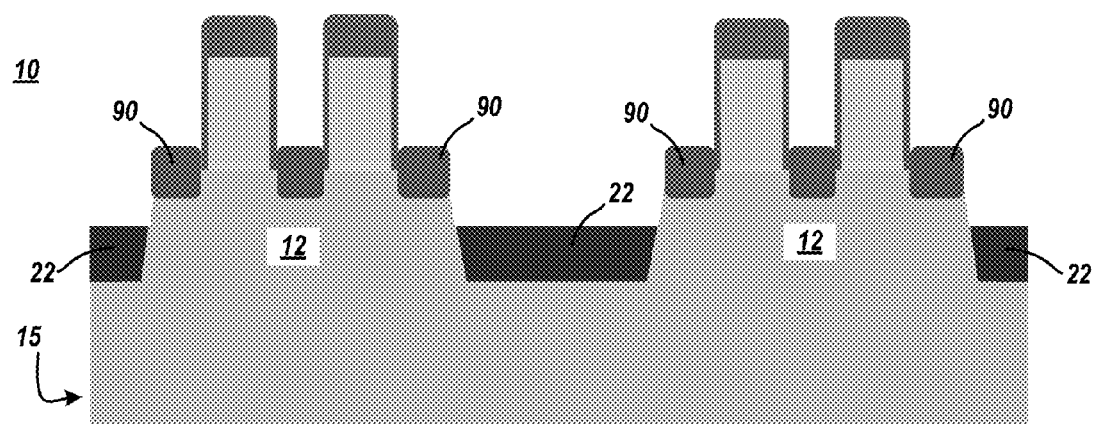

FIG. 10 depicts a cross section view of a semiconductor structure 10 at an intermediate stage of semiconductor device fabrication, in accordance with various embodiments of the present invention. At this stage of fabrication, the PFET (e.g. As/P halo and B extension, etc.) and the NFET (e.g. B halo and As/P extension, etc.) regions of structure 10 may be implanted with respective dopants to set the overlap capacitance, extension resistance and/or threshold voltage. These implanted dopants may be referred to as halo and extension implants. Further at the stage of fabrication, fin portions in the source drain region of the fin may be recessed to create fin 12 segments. Even further at this stage of fabrication, epitaxy 90 may be formed within the fin recesses to merge the fin 12 segments so as to form the source and drain junctions, reduce contact resistance, increase stress to the channel region, and reduce the spreading resistance, etc.

In certain embodiments, halo implants may added using photolithography, ion implantation, and resist strip (performed once for NFETs and once for PFETs) and may be followed by forming source/drain extension implants using photolithography, ion implantation, and resist strip (performed once for NFETs and once for PFETs). The ion implantation dopants may be chosen, as is known in the art, to set the overlap capacitance, extension resistance and/or threshold voltage. In certain embodiments, an annealing process may be performed to activate the source/drain extensions, such as, using laser anneal or flash anneal, to avoid the loss of source/drain extension implants.

In various embodiments, the portions of fins 12 in the source/drain region of structure 10 may be recessed or removed using any suitable etching technique such as dry etch, wet etch, or combination of both. The etching technique may require a etch mask to be formed upon and to protect portions of semiconductor device 10. For example, the portions of fins 12 may be removed by known patterning and etching procedures of the VLSI arts, such as, for instance, reactive ion etching (RIE). A first etch process may remove portions of fins 12 and may penetrate to an upper surface (e.g. of portions 22, substrate 15, etc.) and a second etch process may remove portions of an underlying material. However, in certain embodiments, a single etch process may be utilized. At this stage of fabrication, the originally continuous fins 12 have been cut into fin segments with each of the gate stacks being associated with particular fin segments. The patterning and etching procedures are used to obtain a depth and side profile of recesses may be chosen according to design purposes and to retain one or more crystalline surface(s) for subsequent epitaxy 90 formation. For instance, the recesses can be formed by a directional dry etch which can form substantially straight sidewalls or by a wet (or other isotropic) etch process which can form undercuts, etc. In an embodiment of the disclosure, following the etching, gate stack sidewalls and possibly other layers around the gate stacks, may be re-formed, or re-fabricated. In certain embodiments, one recess process may be completed for NFET regions of structure 10 and another recess process may be completed for PFET regions of structure 10. Generally, the recess may be removed by other known processes without deviating from the spirit of those embodiments herein claimed.

In certain embodiments, epitaxy 90 may be formed within the fin recesses to merge the fin 12 segments so as to form the source and drain junctions, reduce contact resistance, increase stress to the channel region, and reduce the spreading resistance, etc. A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4-9e20 dopant levels preferred.

Epitaxy 90 may be epitaxially grown upon fin 12 segment sidewalls. In various embodiments, fin 12 segment sidewalls have a <110> orientation from which epitaxy may be grown. When epitaxy growth from neighboring fin segments, <111> bound diamond shaped epitaxy structures may merge. For example, the tips of neighboring the diamond shaped epitaxy may meet and a <100> plane is formed there between allowing for further epitaxial growth from the <100> plane, thereby merging fin segments.

The material of the fins 12 may itself serve as the seed surface for the epitaxial growth of the material of epitaxy 90. The epitaxy 90 growth may be carried out in a selective manner, meaning that the epitaxial growth occurs only over certain surfaces, while other surfaces stay essentially free of the epitaxy material. Selective epitaxial growth has known techniques in the art. In certain embodiments, possible surplus epitaxial material may be removed. Such removal may take the form of various dry or wet etchings, including timed and selective etchings, or removal by polishing, as these are all known techniques in the art. The epitaxial growth may be stopped once the epitaxy material growing on the sidewalls merge and a continuous material has been formed with the material of fin 12 alternating with the epitaxial growth material of epitaxy 90.

The epitaxy 90 material may be selected as to have differing etch properties in relation to the material of the fins 12. It may be desirable that for certain selective etches the material of the fins 12 etches at a faster rate than the epitaxy 90 material. Such requirements may be satisfied in embodiments of the invention by several different combinations of material selections. Some of the combinations may include: the fins 12 being essentially pure Si, and the epitaxy 90 material being a SiGe alloy mixture with e.g. between 20% and 60% Ge concentration. Or, the fin 12 material may essentially be pure Si or SiGe alloy mixture, and the epitaxy 90 may be Si:C with e.g. between 1% and 5% C concentration. In alternate embodiments, the fin 12 material may be a SiGe alloy mixture, typically with less than 15% Ge concentration, and the epitaxy 90 material may also be a SiGe alloy mixture, but with a differing Ge concentration than that of the fin 12 material. Typically, if the Ge concentration differs between the fin 12 material and epitaxy 90 material by at least 20%, that may be sufficient to lead to the desired difference in etching rates. In alternate embodiments the fin 12 material may be a SiGe alloy mixture, typically with less than 15% Ge concentration, and the epitaxy 90 material may be Si:C with between 1% and 5% C concentration. Or, the fin 12 material may be a Si:C, and the epitaxy 90 material being a SiGe alloy mixture with between 20% and 60% Ge concentration. In further embodiments, the fin 12 material may be a SiGe alloy mixture, with between 20% and 60% Ge concentration, and the epitaxy 90 material may be essentially pure Si. In further embodiments the epitaxy 90 material may be a non-Si based semiconductor, for instance, a compound semiconductor, such as, without limiting intent, gallium arsenide.

In certain embodiments, it may be desirable to achieve low resistivity electrical connections between fin segments. Consequently, one may dope the epitaxy 90 material to similar conductivity as the fin 12. Such doping may be performed during the epitaxial growth, in so called in-situ doping schemes, as known in the art. Both p-type and n-type dopants are well known in the art, and any of them may be used in the embodiments of the present disclosure for doping both the fin 12 material and the epitaxy 90 material.

Generally, fin 12 recessing, ion implantation, and epitaxy 90 formation to merge fin segments within source/drain regions of semiconductor structure 10 may be achieved by other known or additional techniques than those described without deviating from the spirit of those embodiments herein claimed.

Figure 11:
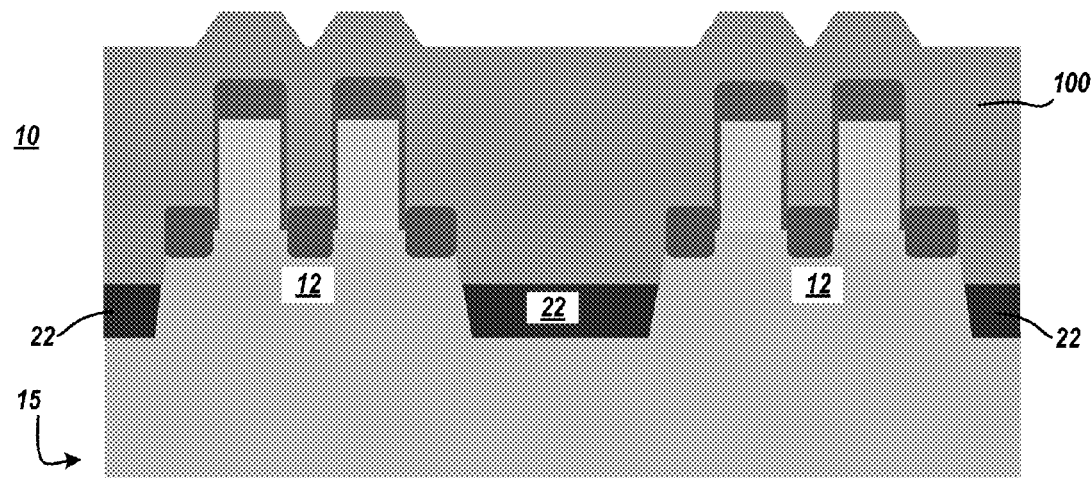

FIG. 11 depicts a cross section view of a semiconductor structure 10 at an intermediate stage of semiconductor device fabrication, in accordance with various embodiments of the present invention. At this stage of fabrication, dielectric material 100 is formed upon structure 10. The orientation of FIG. 11 illustrates a view plane parallel to fins 12. In various embodiments, dielectric material 100 may be a nitride layer deposited upon structure 10. In particular embodiments, dielectric material 100 may be deposited by e.g. CVD, ALD, PECVD, or other known formation techniques. In certain embodiments, dielectric material 100 is deposited with a thickness sufficient to cover the gate stacks. The thickness of dielectric material 100 may be from 10 nm to 500 nm, although lesser and greater thicknesses have been contemplated and are employed in further embodiments. Generally, dielectric material 100 may be formed by other known or additional techniques than those described without deviating from the spirit of those embodiments herein claimed.

Figure 12:
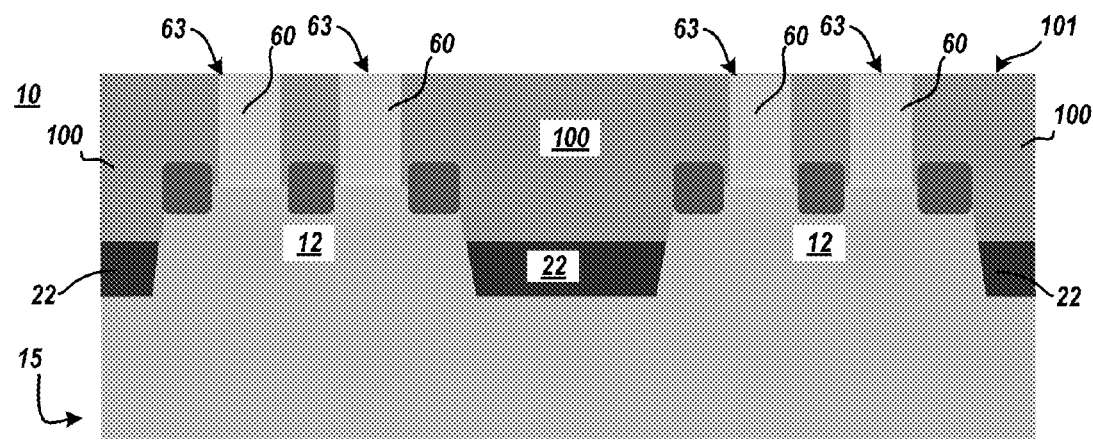

FIG. 12 depicts a cross section view of a semiconductor structure 10 at an intermediate stage of semiconductor device fabrication, in accordance with various embodiments of the present invention. At this stage of fabrication, dielectric material 100 above dummy gates 60 is removed. The orientation of FIG. 12 illustrates a view plane perpendicular to fins 12.

Dielectric material 100 may be planarized to the top surface 63 of dummy gates 60 using CMP technique 30. In one embodiment, the CMP technique 30 may use a ceria based slurry to recess the dielectric layer 20. The CMP technique 30 may be designed to improve planarity of an upper surface 101 of dielectric material 100 and one or more top surfaces 63 of dummy gates 60 and may advantageously eliminate non planer surfaces of structure 10. The specific CMP technique 30 may be chosen to effectively stop at the top surface 63 of dummy gate 60. For example, the CMP technique 30 may stop at the silicon material of dummy gates 60. In certain embodiments, the CMP technique 30 removes remove cap 62 and associated spacer 70 material above dummy gate 60 along with excess dielectric material 100 to expose the dummy gate 60. Generally, dielectric material 100 above dummy gates 60 may be removed with other known or additional techniques than those described without deviating from the spirit of those embodiments herein claimed.

Figure 13:
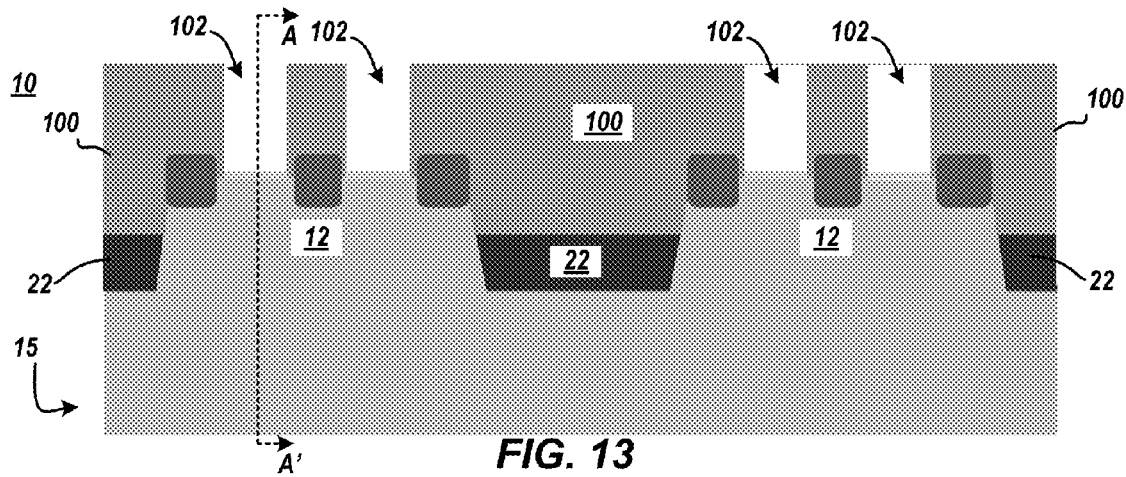

FIG. 13 depicts a cross section view of a semiconductor structure 10 at an intermediate stage of semiconductor device fabrication, in accordance with various embodiments of the present invention. At this stage of fabrication, dummy gates 60 are removed. The orientation of FIG. 13 illustrates a view plane perpendicular to fins 12.

According to an exemplary embodiment, dummy gates 60 may be removed using wet chemical etching or dry etching. As highlighted above, the dummy gates 60 may be formed from poly-silicon. In that case, the dummy gates 60 can be removed using a silicon-specific RIE process that may be selective to gate oxide portion 61. The gate oxide portion 61 may serve to protect the source and drain regions of structure 10 during this etching process. As a result of the dummy gate 60 removal process, those portions of the fins 12 that were once covered by the dummy gate 60 (e.g. channel region of structure 10, etc.) are now exposed. The removal of the dummy gates 60 will result in a trench 102 being formed between the source and drain regions of structure 10. Generally, dummy gates 60 may be removed with other known or additional techniques than those described without deviating from the spirit of those embodiments herein claimed.

Figure 14:
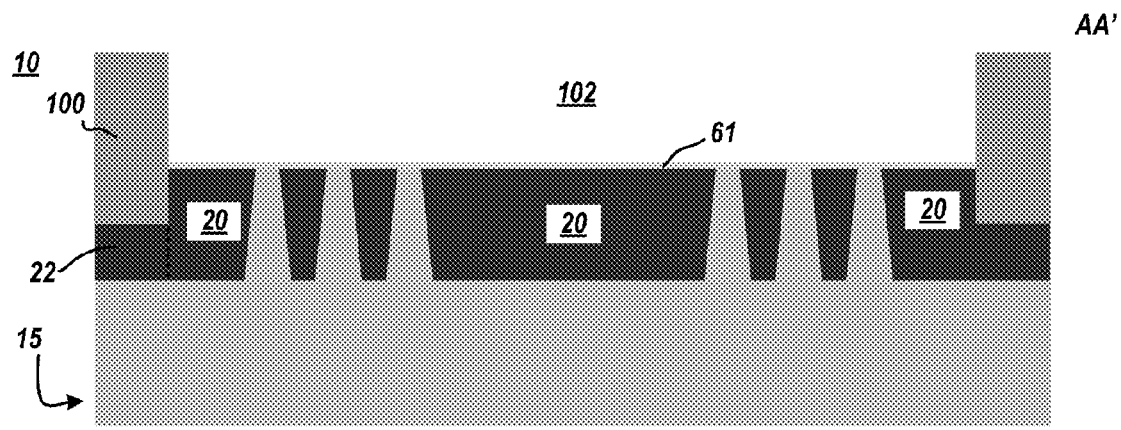

FIG. 14 depicts a cross section view of a semiconductor structure 10 at a similar stage of semiconductor device fabrication as shown in FIG. 13. The orientation of FIG. 14 illustrates a view along the A-A' plane as shown in FIG. 13. FIG. 14 similarly depicts the removal of dummy gates 60.

Figure 15:
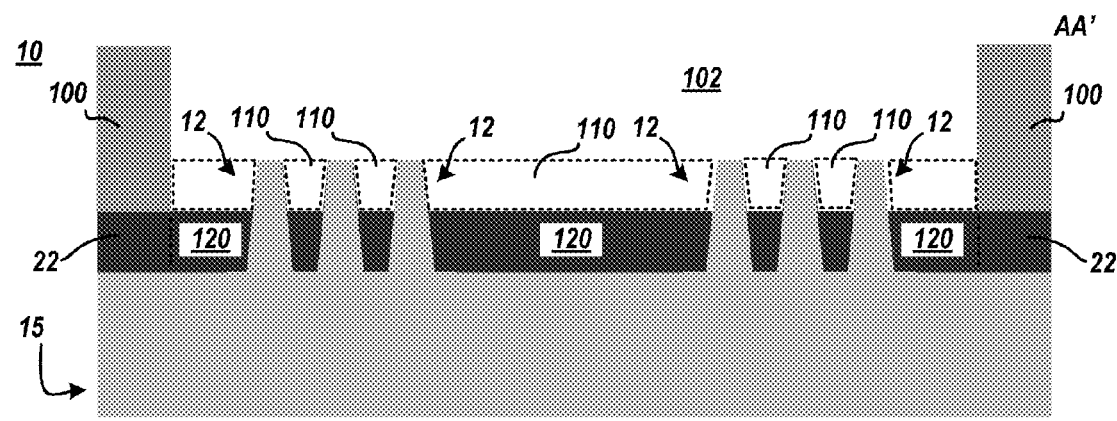

FIG. 15 depicts a cross section view of a semiconductor structure 10 at an intermediate stage of semiconductor device fabrication, in accordance with various embodiments of the present invention. At this stage of fabrication, fins 12 are partially revealed upon the channel regions of structure 10. The orientation of FIG. 15 illustrates a view along the A-A' plane as shown in FIG. 13.

Fins 12 are partially revealed by for example, etching to remove gate oxide portions 61 and portions 110 of dielectric layer 20 within channel regions of semiconductor structure 10. The gate oxide portions 61 and portions 110 of dielectric layer 20 may be removed using any suitable etching technique such as dry etch, wet etch, or combination of both. The etching technique may require a etch mask to be formed upon and to protect portions of semiconductor device 10 which resists etching and may be a photoresist or a more durable mask, such as silicon nitride. In particular embodiments, fins 12 are partially revealed using an isotropic oxide wet etch timed to remove portions 110 of dielectric layer 20 to expose partial sidewalls 15 of fins 12 and to retain portions 120 of dielectric layer 20. In certain embodiments, the etchant is chosen to provide a selective removal of portions 100 within channel regions of semiconductor structure 10 whilst not removing fins 12. In certain embodiments, the height of portions 110 and the height of portions 120 may be approximately equal. In certain embodiments, top surface of dielectric portions 22 are coplanar with top surface of dielectric portions 120. In other words, the etch of dielectric layer 20 in the channel regions of structure 10 may be to a similar depth as the etch of dielectric layer 20 in the source drain regions of structure 10 as depicted in FIG. 8. Generally, fins 12 may be partially revealed within channel regions of structure 10 by other known or additional techniques than those described without deviating from the spirit of those embodiments herein claimed.

Figure 16:
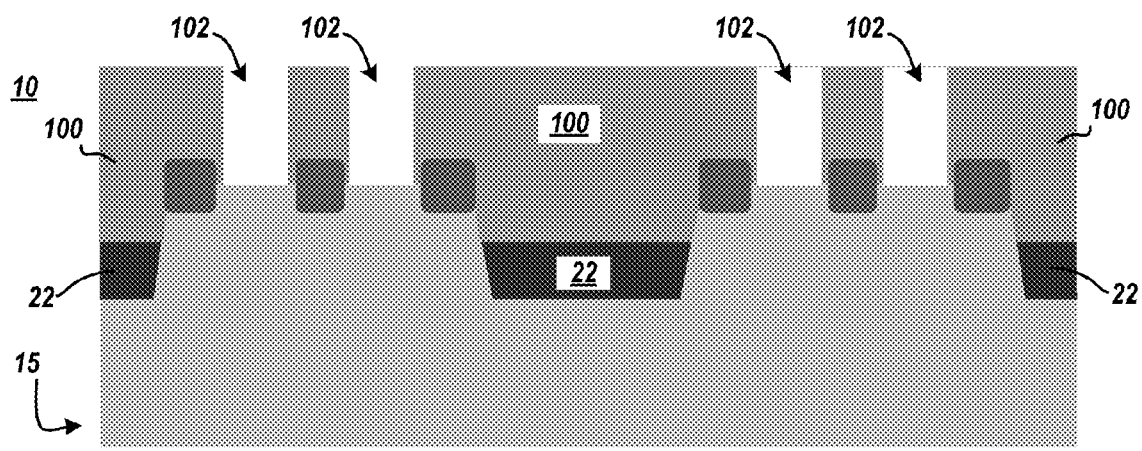

FIG. 16 depicts a cross section view of a semiconductor structure 10 at a similar stage of semiconductor device fabrication as shown in FIG. 15. The orientation of FIG. 16 illustrates a view plane parallel to fins 12 and similarly depicts the partial reveal of fins 12 within the channel regions of structure 10.

In various embodiments of the present invention, the fins 12 reveal by removing gate oxide portions 61 and portions 110 of dielectric layer 20 within channel regions of semiconductor structure 10 is a late FinFET reveal such that fins 12 are revealed late in semiconductor 10 fabrication. The fin 12 may be therefore revealed or otherwise functionally formed subsequent to removing dummy gates in a replacement gate fabrication flow. This late fin 12 reveal reduces front end of line topologies so that subsequent fabrication techniques may be improved.

Figure 17:
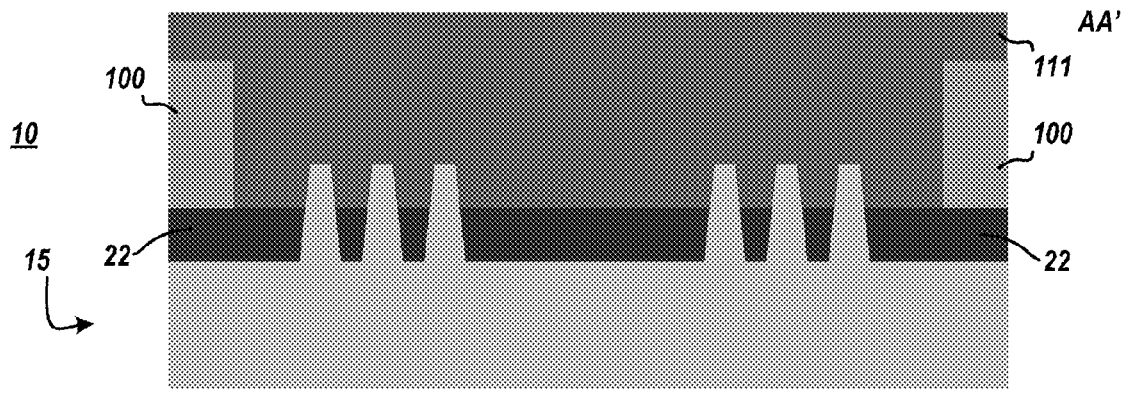
Figure 18:
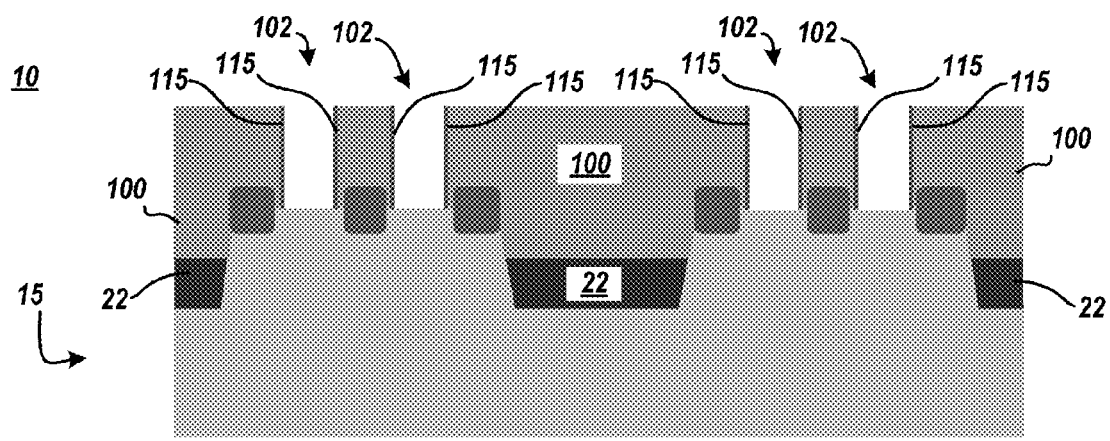

FIG. 17 depicts a cross section view of a semiconductor structure 10 at an intermediate stage of semiconductor device fabrication. At this stage of fabrication, dielectric layer 111 is formed. The orientation of FIG. 17 illustrates a view plane perpendicular to fins 12. Dielectric layer 111 may be a silicon oxide, silicon oxynitride, etc. material formed upon structure 10. Dielectric layer 110 may be patterned and etched to remove portions of the dielectric layer 111 and retain other portions of dielectric layer 111. For example, a retained portion of dielectric layer 111 may retain on high voltage areas or regions (e.g. high voltage FET areas, etc.) of structure 10 to implement a thick oxide FET device. Generally, dielectric layer 111 may be formed by other known or additional techniques than those described without deviating from the spirit of those embodiments herein claimed FIG. 18 depicts a cross section view of a semiconductor structure 10 at an intermediate stage of semiconductor device fabrication. At this stage of fabrication, inner spacers 115 are formed. The orientation of FIG. 18 illustrates a view plane parallel to fins 12. Inner spacers 115 may be a dielectric such as silicon oxide, silicon oxynitride, etc. material formed upon trench 102 sidewalls. For example, inner spacer 115 material may be deposited within trenches 102 and etched to retain inner spacers 115 upon trench 102 sidewalls.

Figure 19:
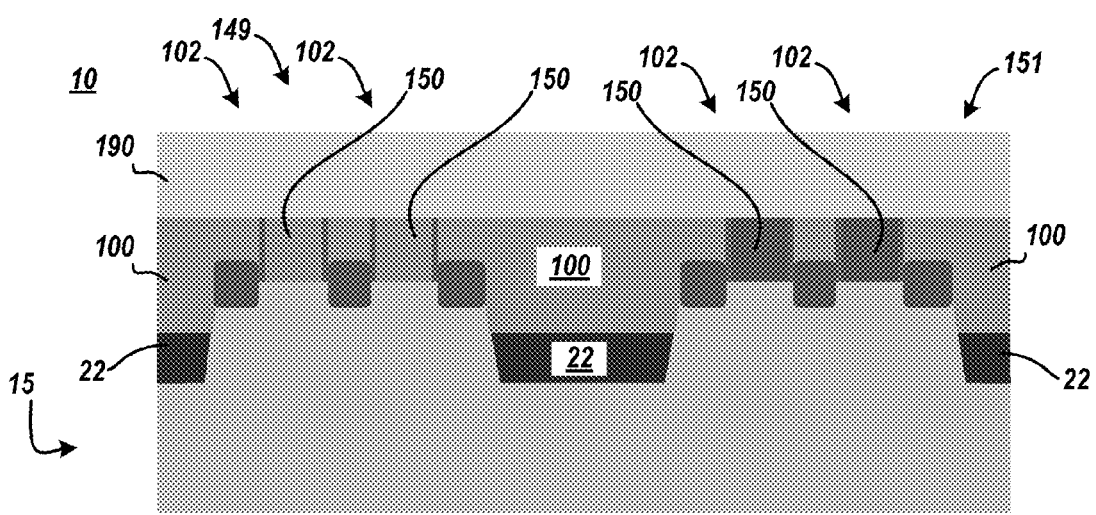

In certain embodiments, inner spacer 115 material may be low-k dielectric material having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. Inner spacers 115 may be of any desirable thickness and may include one or more dielectric layers. In some embodiments, inner spacers 115 may be deposited with a conformal deposition technique and may be beneficial for reduction of parasitic capacitance and circuit performance improvement. Generally, inner spacers 115 may be formed by other known or additional techniques than those described without deviating from the spirit of those embodiments herein claimed FIG. 19 depicts a cross section view of a semiconductor structure 10 at an intermediate stage of semiconductor device fabrication, in accordance with various embodiments of the present invention. At this stage of fabrication, replacement gates 150 are formed. The orientation of FIG. 19 illustrates a view plane perpendicular to fins 12.

Replacement gates 150 may be formed over/covering at least a portion of each of the fins in the channel region. According to an exemplary embodiment, the replacement gate 150 is formed by filling the trench 102 left by removal of the dummy gate 60 with a gate material (so as to cover the fins 12). Once the gate material is filled in the trench, a CMP technique 30 can be used to planarize the gate material and upper surface of dielectric material 100. Suitable gate materials include, but are not limited to, one or more of polysilicon, a deposited metal(s) and a hybrid stack of multiple materials such as metal polysilicon. In the example shown in FIG. 19, the spacers 160 may be reformed upon the trench 102 sidewalls prior to forming replacement gates 150. The replacement gates 150 may be formed as, for example, P-type gate stack(s) 149 or N-type gate stack(s) 151. Though shown as a last stage of fabrication, structure 10 may undergo further fabrication steps that may add or remove partial or blanket layers 190, materials, etc. in further front end of line, middle end of line, or back end of line fabrication steps to form a semiconductor device.

Figure 20:
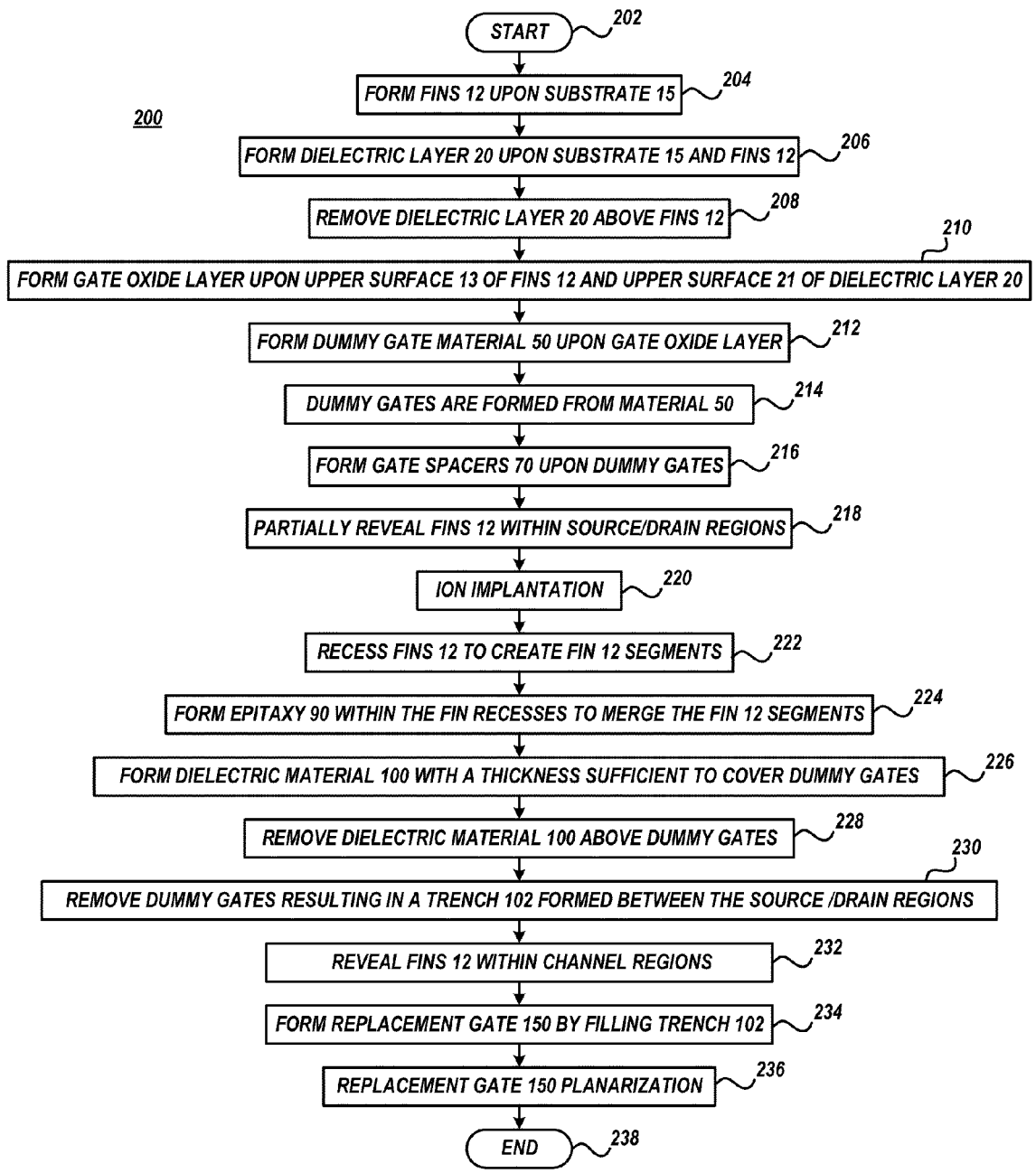
FIG. 20 depicts an exemplary fabrication process flow method, in accordance with various embodiments of the present invention.

FIG. 20 depicts an exemplary process flow method 200 for manufacturing a semiconductor device, in accordance with various embodiments of the present invention. Method 200 begins at block 202 and continues by forming fins 12 upon semiconductor structure 10 (block 204). For example, fins 12 may be formed upon a layered substrate 15a or a bulk substrate 15b of semiconductor structure 10. An exemplary depiction of semiconductor structure 10 subsequent to block 204 processes or techniques is shown in FIG. 1. Method 200 may continue with forming dielectric layer 20 upon substrate 15 and fins 12 (block 206). An exemplary depiction of semiconductor structure 10 subsequent to block 206 processes or techniques is shown in FIG. 2. Method 200 may continue with removing dielectric layer 20 material above fins 12 (block 208). For example, CMP technique 30 may be utilized with a stop upon upper surface 13 of fins 12. Subsequent to CMP technique 30 upper surface 13 and upper surface 21 of dielectric layer 21 may be coplanar. An exemplary depiction of semiconductor structure 10 subsequent to block 208 processes or techniques is shown in FIG. 3.

Method 200 may continue with forming gate oxide layer 40 upon upper surface 13 and upper surface 21 (block 210). An exemplary depiction of semiconductor structure 10 subsequent to block 210 processes or techniques is shown in FIG. 4. Method 200 may continue with forming dummy gate material 50 upon gate oxide layer 40 (block 212). An exemplary depiction of semiconductor structure 10 subsequent to block 212 processes or techniques is shown both in FIG. 5A and FIG. 5B. Method 200 may continue with forming dummy gate from material 50 (block 214). For example, the dummy gate material may be patterned and etch processes may be utilized for form dummy gates 60. In certain embodiments, gate stacks including gate oxide portion 61 formed from gate oxide layer 40, dummy gate 60 formed from dummy gate material 50, and a cap 62 formed from a cap layer may be formed. An exemplary depiction of semiconductor structure 10 subsequent to block 214 processes or techniques is shown in FIG. 6.

Method 200 may continue with forming gate spacers 70 upon dummy gates (block 216). An exemplary depiction of semiconductor structure 10 subsequent to block 216 processes or techniques is shown both in FIG. 7. Method 200 may continue with partially revealing fins 12 within semiconductor structure 10 source/drain regions (block 218). For example, portions 80 of dielectric layer 20 may be removed in semiconductor structure 10 source/drain regions exposing fin 12 sidewalls 14. Below the removed portions 80 portions 22 of dielectric layer 20 may remain. An exemplary depiction of semiconductor structure 10 subsequent to block 218 processes or techniques is shown in FIG. 8, FIG. 9A, and FIG. 9B.

Method 200 may continue with ion implantation (block 220) with recessing fin 12 to create fin 12 segments (block 222) and forming epitaxy 90 within the fin recesses to merge the fin 12 segments (block 224). An exemplary depiction of semiconductor structure 10 subsequent to block 220, 222, and/or 224 processes or techniques is shown in FIG. 10. Method 200 may continue with forming dielectric material 100 to cover dummy gates (block 226). An exemplary depiction of semiconductor structure 10 subsequent to block 226 processes or techniques is shown in FIG. 11. Method 200 may continue with removing dielectric material 100 above dummy gates (block 228). For example, CMP technique 30 may be utilized with a stop upon upper surface 63 gate 60. Subsequent to CMP technique 30 upper surface 63 and an upper surface 101 of dielectric material 100 may be coplanar. An exemplary depiction of semiconductor structure 10 subsequent to block 228 processes or techniques is shown in FIG. 12.

Method 200 may continue with removing dummy gates resulting in a trench 120 formed between the source and drain regions of semiconductor 10 (block 230). For example, etching processes may be used to remove dummy gates 60. An exemplary depiction of semiconductor structure 10 subsequent to block 230 processes or techniques is shown in FIG. 13 and FIG. 14. Method 200 may continue with revealing fins 12 within channel regions of semiconductor structure 10, resulting in a late fin reveal (block 232). An exemplary depiction of semiconductor structure 10 subsequent to block 232 processes or techniques is shown in FIG. 15 and FIG. 16.

In certain embodiments, method 200 may include forming dielectric layer 110 and etching dielectric layer 110 to retain a portion of dielectric layer on high voltage areas or regions (e.g. high voltage FET areas, etc.) of structure 10 to implement a thick oxide FET device. An exemplary depiction of semiconductor structure 10 depicting such formatting processes is shown in FIG. 17.

In certain embodiments, method 200 may include forming inner spacers 115. For example, a dielectric such as silicon oxide, silicon oxynitride, etc. or a low-k dielectric material may be formed upon trench 102 sidewalls to reduce parasitic capacitance and improve circuit performance. An exemplary depiction of semiconductor structure 10 subsequent such processes or techniques is shown in FIG. 19.

Method 200 may continue with forming replacement gates 150 (block 234) and replacement gate planarization (block 236). An exemplary depiction of semiconductor structure 10 subsequent to block 234 and/or 236 processes or techniques is shown in FIG. 19. In certain embodiments, method 200 may continue with further semiconductor fabrication techniques that may add or remove partial or blanket layers 190, materials, etc. in further front end of line, middle end of line, or back end of line fabrication steps to form a semiconductor device. Method 200 ends at block 238.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A FinFET semiconductor device fabrication process comprising:
    forming a plurality of FinFET fins upon a semiconductor substrate;
    forming a first dielectric layer upon the semiconductor substrate, an upper surface of the first dielectric layer being coplanar with upper surfaces of the FinFET fins;
    forming a plurality of dummy gates upon the FinFET fins and the first dielectric layer orthogonal to the FinFET fins;
    revealing first segments of the FinFET fins by removing first portions of the first dielectric layer covering the FinFET fins in source-drain regions adjacent to respective dummy gates;
    subsequent to revealing first segments of the FinFET fins, removing the dummy gates, and;
    subsequent to the removal of the dummy gates, revealing second segments of the FinFET fins by removing second portions of the first dielectric layer covering the FinFET fins in channel regions.

2. The FinFET semiconductor device fabrication process of claim 1, wherein forming the first dielectric layer upon the semiconductor substrate comprises:
    depositing the first dielectric layer upon the semiconductor substrate covering the FinFET fins, and;
    planarizing the first dielectric layer so that the upper surface of the first dielectric layer is coplanar with the upper surfaces of the FinFET fins.

3. The FinFET semiconductor device fabrication process of claim 2, further comprising:
    forming a gate oxide layer upon the upper surface of the first dielectric layer and the upper surface of the plurality of FinFET fins.

4. The FinFET semiconductor device fabrication process of claim 3, wherein forming the plurality of dummy gates upon the semiconductor substrate comprises:
    forming dummy gate material upon the gate oxide layer, and;
    patterning the plurality of dummy gates from the dummy gate material.

5. The FinFET semiconductor device fabrication process of claim 4, further comprising:
    forming gate spacers adjacent to sidewalls of the plurality of dummy gates.

6. The FinFET semiconductor device fabrication process of claim 5, further comprising:
    recessing the plurality of FinFET fins to create fin segments, and;
    growing epitaxy within the recesses to merge the fin segments.

7. The FinFET semiconductor device fabrication process of claim 6, further comprising:
    subsequent to revealing the first segments of the FinFET fins by removing first portions of the dielectric layer from source-drain regions, depositing a second dielectric layer upon the first dielectric layer covering the revealed first portions of the FinFET fins and the dummy gates, and;
    planarizing the second dielectric layer so that an upper surface of the second dielectric layer is coplanar with upper surfaces of the dummy gates.

8. The FinFET semiconductor device fabrication process of claim 3, wherein the gate oxide layer associated with each dummy gate is retained subsequent to removing the dummy gates.

9. The FinFET semiconductor device fabrication process of claim 1, wherein the semiconductor substrate is a bulk semiconductor substrate.

10. The FinFET semiconductor device fabrication process of claim 1, wherein the semiconductor substrate is a silicon-on-insulator semiconductor substrate.

11. A FinFET semiconductor device fabrication process comprising:
    forming a plurality of FinFET fins upon a semiconductor substrate;
    forming a first dielectric layer upon the semiconductor substrate, an upper surface of the first dielectric layer being coplanar with upper surfaces of the FinFET fins;
    forming a plurality of dummy gates upon the FinFET fins and the first dielectric layer orthogonal to the FinFET fins;
    revealing first segments of the FinFET fins by removing first portions of the first dielectric layer covering the FinFET fins in source-drain regions adjacent to respective dummy gates;
    subsequent to revealing first segments of the FinFET fins, removing the dummy gates resulting in a plurality of channel region trenches, and;
    subsequent to the removal of the dummy gates, revealing second segments of the FinFET fins by removing second portions of the first dielectric layer covering the FinFET fins in channel regions accessible via the channel region trenches.

12. The FinFET semiconductor device fabrication process of claim 11, further comprising:
    subsequent to revealing the second segments of the FinFET fins by removing second portions of the dielectric layer from channel regions, forming replacement gates within the channel region trenches.

13. The FinFET semiconductor device fabrication process of claim 12, wherein forming replacement gates within the channel region trenches comprises:
    forming a gate oxide layer upon the retained dielectric layer and the recessed plurality of FinFET fins;
    forming gate material upon the gate oxide layer, and;
    forming a gate cap upon the gate material.

14. The FinFET semiconductor device fabrication process of claim 12, further comprising:

subsequent to revealing the first segments of the FinFET fins by removing first portions of the dielectric layer from source-drain regions, depositing a second dielectric layer upon the first dielectric layer covering the revealed first portions of the FinFET fins;

planarizing the replacement gates so that upper surfaces of the replacement gates is coplanar with the top surface of the second dielectric layer.

15. The FinFET semiconductor device fabrication process of claim 11, wherein upper surfaces of the first portions of the first dielectric layer are coplanar with upper surfaces of the second portions of the first dielectric layer.

16. The FinFET semiconductor device fabrication process of claim 11, wherein the removal of the first portions of the first dielectric layer from source-drain regions and the removal of the second portions of the first dielectric layer from channel regions results in a retained dielectric layer surrounding the FinFET fins.

17. The FinFET semiconductor device fabrication process of claim 16, wherein an upper surface of the retained dielectric layer is below the upper surfaces of the FinFET fins.

18. The FinFET semiconductor device fabrication process of claim 11,
subsequent to revealing the FinFET fins by removing second portions of the dielectric layer from channel regions, forming spacers adjacent to sidewalls of the channel region trenches.

19. A FinFET semiconductor device fabrication process comprising:
forming a plurality of FinFET fins upon a semiconductor substrate;
forming a first dielectric layer upon the semiconductor substrate, an upper surface of the first dielectric layer being coplanar with upper surfaces of the FinFET fins;
forming a plurality of dummy gates upon the FinFET fins and the first dielectric layer orthogonal to the FinFET fins;
revealing first segments of the FinFET fins by removing first portions of the first dielectric layer covering the FinFET fins in source-drain regions;
subsequent to revealing the first segments of the FinFET fins, depositing a second dielectric layer upon the first dielectric layer covering the revealed first portions of the FinFET fins;
removing the dummy gates resulting in a plurality of channel region trenches;
subsequent to the removal of the dummy gates, revealing second segments of the FinFET fins by removing second portions of the first dielectric layer covering the FinFET fins in channel regions;
subsequent to revealing the second segments of the FinFET fins by removing second portions of the dielectric layer from channel regions adjacent to the FinFET fins, forming replacement gates within the channel region trenches, and;
subsequent to removing the dummy gates, forming a third dielectric layer upon the second dielectric layer and upon the first dielectric layer within the channel region trenches covering the FinFET fins.

20. The FinFET semiconductor device fabrication process of claim 19, further comprising:
prior to the forming replacement gates, removing the third dielectric layer material within the channel region trenches.

* * * * *